(12) United States Patent
Choi

(10) Patent No.: US 7,400,048 B2
(45) Date of Patent: Jul. 15, 2008

(54) VOID-FREE CIRCUIT BOARD AND SEMICONDUCTOR PACKAGE HAVING THE SAME

(75) Inventor: Bong Rak Choi, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 56 days.

(21) Appl. No.: 11/457,767

(22) Filed: Jul. 14, 2006

(65) Prior Publication Data
US 2007/0096337 A1 May 3, 2007

(30) Foreign Application Priority Data
Oct. 10, 2005 (KR) .................. 10-2005-0095027

(51) Int. Cl.
*H01L 29/40* (2006.01)
(52) U.S. Cl. .................... 257/778; 257/787
(58) Field of Classification Search ............ 257/778, 257/737, 738, 787
See application file for complete search history.

(56) References Cited

U.S. PATENT DOCUMENTS 5,647,123 A * 7/1997 Greenwood et al. .......... 29/840
6,048,656 A * 4/2000 Akram et al. ............... 438/118
6,458,681 B1 * 10/2002 DiStefano et al. ........... 438/612
2002/0060368 A1 * 5/2002 Jiang ........................ 257/778

FOREIGN PATENT DOCUMENTS

JP 2000-216195 A 8/2000

OTHER PUBLICATIONS

Chinese Intellectual Property Office, Office Action mailed Jan. 18, 2008 and English Translation.

* cited by examiner

*Primary Examiner*—Roy Potter
(74) *Attorney, Agent, or Firm*—Lowe Hauptman Ham & Berner

(57) ABSTRACT

A void-free circuit board and a semiconductor package having the same includes a protective layer covering and protecting an electrode pattern formed on an upper surface of a substrate. The protective layer is applied a solder ball provided on the electrode pattern except on an immediate vicinity of the solder ball to form an opening. The semiconductor package also includes at least one gap compensation part comprising a protrusion that comes in contact with an underfill material injected to the opening before the electrode pattern. The protrusion has a thickness substantially the same as that of a portion of the electrode pattern exposed in the opening. This prevents voids with air captured therein due to non-uniform capillary action during injection of the underfill material.

26 Claims, 7 Drawing Sheets

(a)

(b)

Y-Y'

(a)

(b)

Y1–Y`1

(a)

(b)

Y3-Y3`

VOID-FREE CIRCUIT BOARD AND SEMICONDUCTOR PACKAGE HAVING THE SAME

CLAIM OF PRIORITY

This application claims the benefit of Korean Patent Application No. 2005-95027 filed on Oct. 10, 2005, in the Korean Intellectual Property Office, the disclosure of which is incorporated herein by reference.

BACKGROUND OF THE INVENTION

1. Field of the Invention

The present invention relates to a void-free circuit board and a semiconductor package having the same. More particularly, a void-free circuit board capable of preventing voids with air captured therein due to non-uniform capillary action resulting from an uneven gap formed between a semiconductor chip and a substrate during a process of injecting underfill material into the gap, thereby preventing a defective product and improving product reliability, and a semiconductor package having the same.

2. Description of the Related Art

Recent trend of compact and miniaturized electronic devices has required high-speed, high-function and high-density mounting methods in the packaging technology of semiconductors. In response to such a demand, flip-chip mounting technology in a chip-scale package has been developed.

The generally known flip-chip mounting technology involves techniques of mounting an unpackaged semiconductor chip on a circuit board to assemble into a semiconductor chip package.

FIG. 1 is a sectional view illustrating a conventional semiconductor package. As shown, electrode patterns 3 are formed as a signal line on an upper surface of a circuit board 2, and solder-resist protective layers 4 are formed in a predetermined thickness above the circuit board 2.

The protective layer 4 is not formed on an immediate vicinity of a connection terminal 3a (see FIG. 2) of the electrode pattern 3, thereby forming an opening 6 exposing the connection terminal 3a of the electrode pattern 3 and an upper surface of the circuit board 2 around the connection terminal 3a.

Solder balls 7 are placed on the connecting terminal 3a of the electrode pattern 3 in a corresponding position to electrode terminals (not shown) formed on the undersurface of a semiconductor chip 1. The semiconductor chip 1 is electrically connected to the circuit board 2 via the solder balls 7.

Mounting the semiconductor chip 1 onto the circuit board 2 as described above forms a gap between the semiconductor chip 1 and the circuit board 2 due to the height of the solder balls 7 attached to the undersurface of the semiconductor chip 1. As a result, the power of supporting the semiconductor chip 1 is weakened and portions in contact with the solder balls 7 may be damaged due to stress from vibration.

Therefore, underfill material made of insulation resin is injected by a dispenser (not shown) between the semiconductor chip 1 and the circuit board 2, and cured to form an underfill part 8 supporting the semiconductor chip 1, thereby completing a flip-chip semiconductor package 10.

However, as shown in FIG. 2(a), as the underfill material is injected in an opposite or different direction from the electrode pattern 3 to form the underfill part 8, the gap between the semiconductor chip 1 and the circuit board 2 is not uniform, resulting in a void in which air fills up the opening 6, as shown in FIG. 2(b).

That is, a gap T1 between the semiconductor chip 1 and the circuit board 2 in the opening 6 is larger than a gap T2 between the protective layer 4 exposed in the opening 6 and the semiconductor chip 1, and thus, capillary action is less effective in the gap T1 during the injection of the underfill material. Consequently, the flow rate of the underfill material moving through the gap T1 is relatively slower than that through the narrower gap T2.

In this case, as shown in FIG. 2(a), the underfill material injected in a direction B between the semiconductor chip 1 and the circuit board 2 flows along a direction C traced in a dotted line, at a slower flow rate in the gap T1 than in the gap T2 to fill up the space between the opening 6 and the semiconductor chip 1. As a result, the underfill material reaching an outer surface of the solder ball 7 captures air to form the void V.

The void V formed in the underfill part 8 is inflated and exploded in a process of heating the underfill part 8 at a high temperature of at least 200 degrees Celcius during a reliability test, quality test or manufacturing process, which has been a major factor for producing a defective product, degrading product reliability.

SUMMARY OF THE INVENTION

The present invention has been made to solve the foregoing problems of the prior art and therefore an object of certain embodiments of the present invention is to provide a void-free circuit board capable of preventing formation of voids with air captured therein due to non-uniform capillary action during a process of injecting underfill material between a semiconductor chip and a substrate.

Another object of certain embodiments of the invention is to provide a semiconductor package which prevents formation of voids with air captured therein due to non-uniform capillary action during a process of injecting underfill material between a semiconductor chip and a substrate, thereby preventing a defective product and improving product reliability.

According to an aspect of the invention for realizing the object, there is provided a void-free circuit board including: a protective layer covering and protecting an electrode pattern formed on an upper surface of a substrate, wherein the protective layer is applied around a solder ball provided on the electrode pattern except on an immediate vicinity of the solder ball to form an opening, and at least one gap compensation part comprising a protrusion that comes in contact with an underfill material injected toward the opening before the electrode pattern, the protrusion having a thickness substantially the same as that of a portion of the electrode pattern exposed in the opening.

Preferably, the gap compensation part has a width substantially the same as that of a portion of the electrode pattern exposed in the opening.

Preferably, the gap compensation part is oriented at least 90 degrees from the electrode pattern about the solder ball.

Preferably, the protrusion of the gap compensation part is extended from the electrode pattern.

Preferably, the protrusion of the gap compensation part is made of the same material as the electrode pattern and formed in a manufacturing process of the electrode pattern.

Preferably, a front end of the protrusion of the gap compensation part is in contact with an inner rim of the protective layer.

Preferably, the protrusion of the gap compensation part is extended from the protective layer to the solder ball.

Preferably, the protrusion of the gap compensation part is made of the same material as the protective layer and formed as the protective layer is applied.

Preferably, a front end of the protrusion of the gap compensation part is extended to a vicinity of an outer surface of the solder ball.

Preferably, the protrusion of the gap compensation part is provided separately without having an end in contact with the electrode pattern nor the other end in contact with the protective layer.

Preferably, the protrusion of the gap compensation part is made of the same material as the electrode pattern and formed in a manufacturing process of the electrode pattern.

Preferably, the protrusion of the gap compensation part is made of the same material as the protective layer and formed as the protective layer is applied.

According to another aspect of the invention for realizing the object, there is provided a flip-chip semiconductor package including: at least one semiconductor chip; a substrate having the semiconductor chip mounted thereon via a solder ball, an electrode pattern formed thereon, and a protective layer applied around the solder ball provided on the electrode pattern except on an immediate vicinity of the solder ball to form an opening; an underfill part formed by underfill material injected through a gap formed between the semiconductor chip and the substrate; and at least one gap compensation part comprising a protrusion that comes in contact with the underfill material injected toward the opening before the electrode pattern, the protrusion having a thickness substantially the same as that of a portion of the electrode pattern exposed in the opening.

Preferably, the gap compensation part has a width substantially the same as that of a portion of the electrode pattern exposed in the opening.

Preferably, the gap compensation part has a thickness substantially the same as that of a portion of the electrode pattern exposed in the opening.

Preferably, the gap compensation part is oriented at least 90 degrees from the electrode pattern about the solder ball.

Preferably, the protrusion of the gap compensation part is extended from the electrode pattern disposed on the substrate.

Preferably, the protrusion of the gap compensation part is made of the same material as the electrode pattern and formed in a manufacturing process of the electrode pattern.

Preferably, a front end of the protrusion of the gap compensation part is in contact with an inner rim of the protective layer.

Preferably, the protrusion of the gap compensation part is extended from the protective layer to the solder ball.

Preferably, the protrusion of the gap compensation part is made of the same material and formed as the protective layer is applied.

Preferably, a front end of the protrusion of the gap compensation part is extended to a vicinity of an outer surface of the solder ball.

Preferably, the protrusion of the gap compensation part is provided separately on the substrate without having an end in contact with the electrode pattern nor the other end in contact with the protective layer.

Preferably, the protrusion of the gap compensation part is made of the same material as the electrode pattern and formed in a manufacturing process of the electrode pattern.

Preferably, the protrusion of the gap compensation part is made of the same material as the protective layer and formed as the protective layer is applied.

Preferably, the protrusion of the gap compensation part protrudes downward from a lower surface of the semiconductor chip to the substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
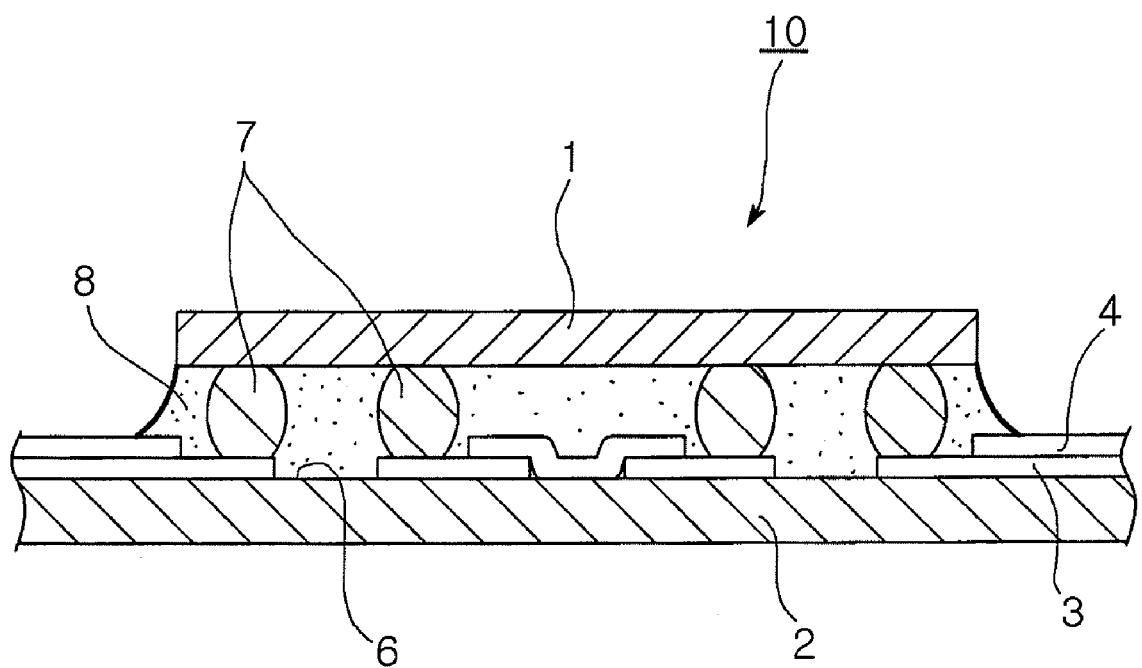
FIG. 1 is a partial sectional view illustrating a conventional flip-chip semiconductor package.
Figure 2:
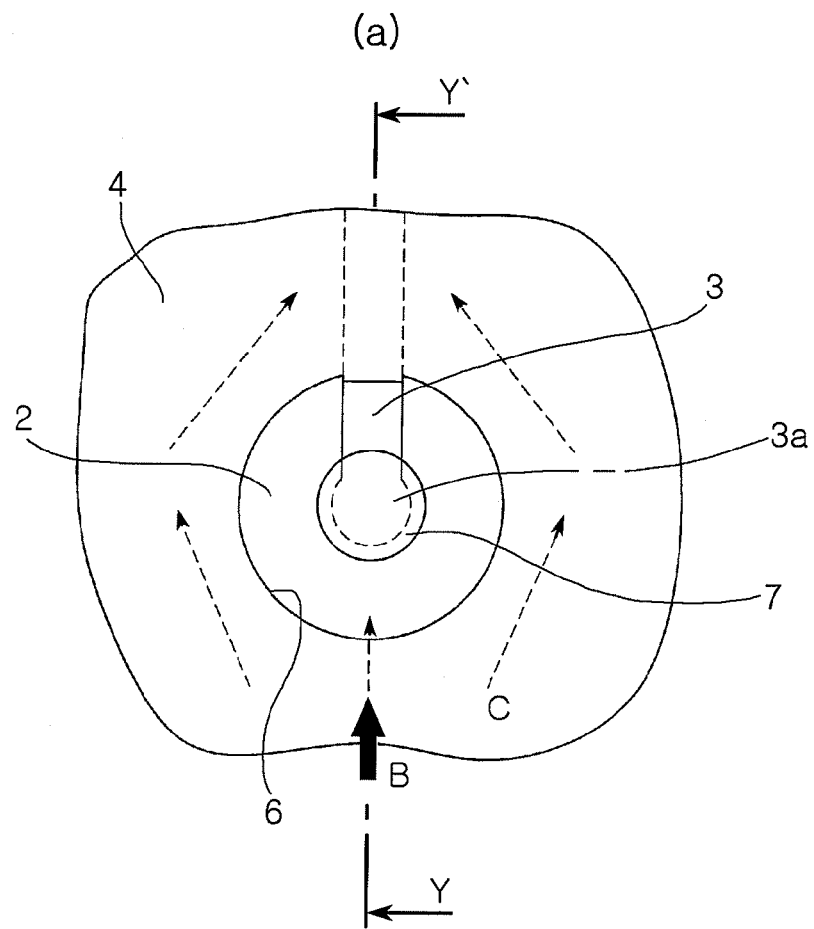
FIG. 2(a) is a partial plan view illustrating a major part of the conventional semiconductor package shown in FIG. 1.
FIG. 2(b) is a partial sectional view taken along line Y-Y' of FIG. 2(a)
Figure 2:
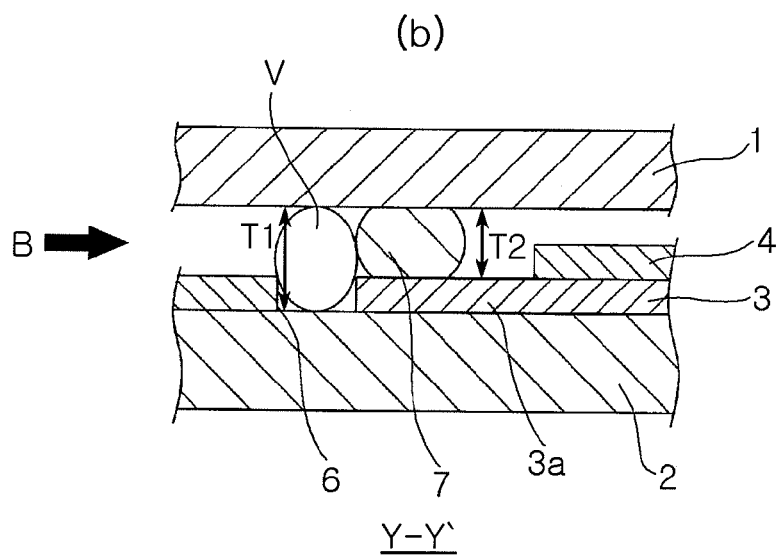
Figure 3:
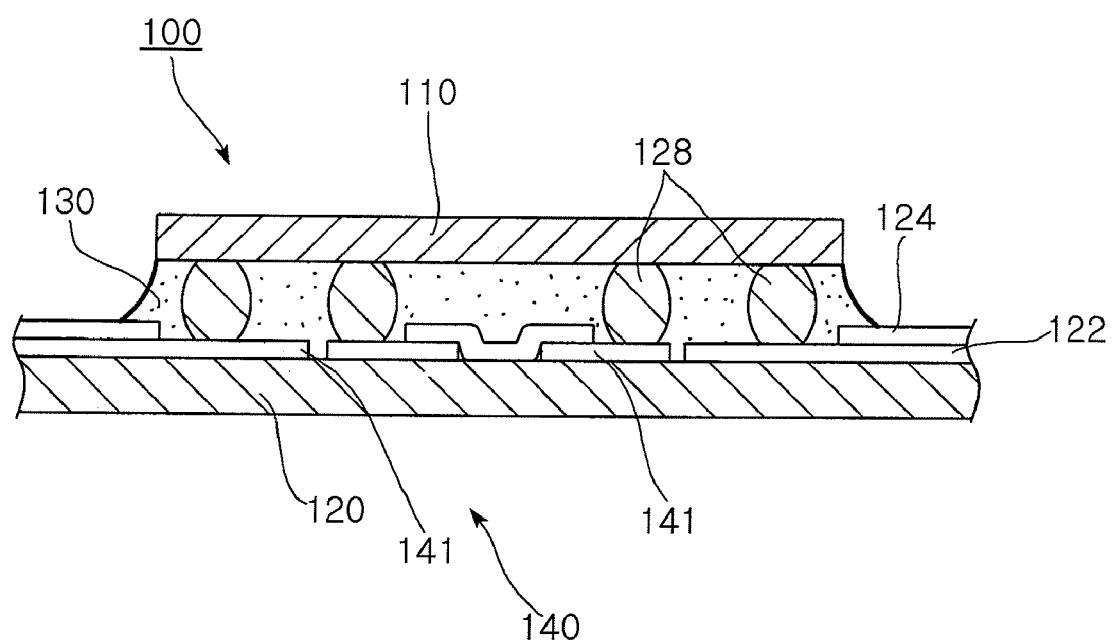
FIG. 3 is a partial sectional view illustrating a flip-chip semiconductor package according to a first embodiment of the present invention.
Figure 4:
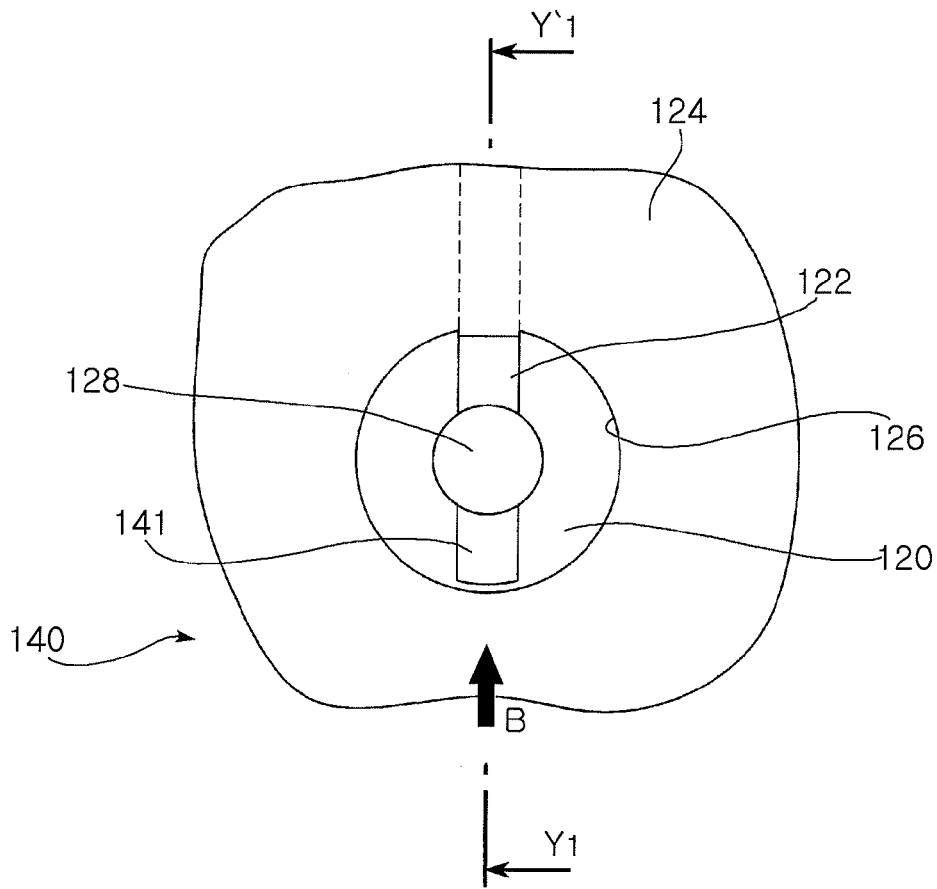
FIG. 4 illustrates the flip-chip semiconductor package according to the first embodiment of the present invention, in which (a) is a plan view of a major part and (b) is a partial sectional view taken along line Y1-Y1 of FIG. 4(a)'.
Figure 4:
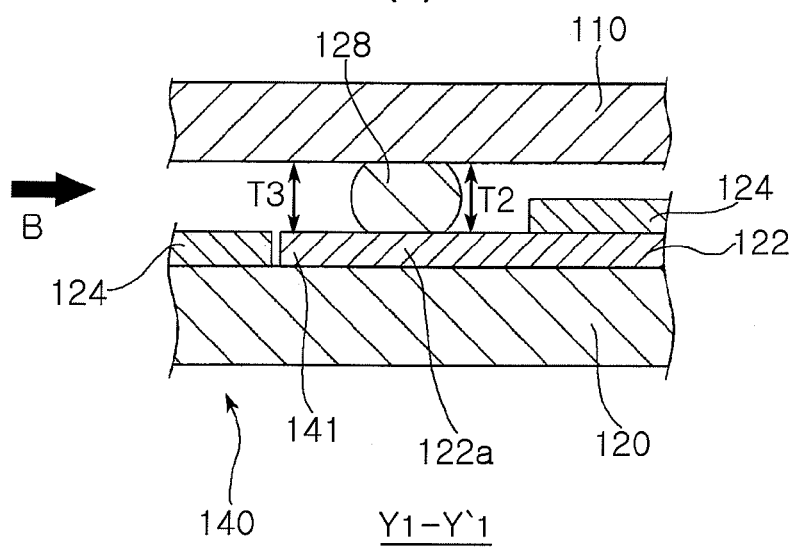

FIG. 3 is a sectional view illustrating a flip-chip semiconductor package according to a first embodiment of the present invention, FIG. 4(a) is a partial plan view illustrating a major part thereof, and FIG. 4(b) is a partial sectional view illustrating the major part thereof.

As shown in FIGS. 3, 4(a) and 4(b), the flip-chip semiconductor package 100 includes a semiconductor chip 110, a substrate 120, an underfill part 130 and a gap compensation part 140.

The semiconductor chip 110 is composed of at least one active chip component flip-chip bonded via solder balls 125 onto an upper surface of the substrate 120.

The substrate 120 has electrode patterns 122 printed or laminated with conductive material such as Cu or Ni according to a pattern designed in advance on an upper surface thereof.

The electrode pattern 122 has a connection terminal 122a at an end thereof, corresponding to an electrode terminal (not shown) formed on an undersurface of the semiconductor chip 110.

A solder-resist protective layer 124 is applied in a predetermined thickness on the electrode pattern 122 formed on an upper surface of the substrate 120 in order to protect the electrode pattern 122 and the substrate 120 during plating or soldering.

The protective layer 124 is not applied in the vicinity of the connection terminal 122 of the electrode pattern 122 to form an opening 126 to thereby expose the connection terminal 122a and a portion of an upper surface of the substrate 120 around the same.

Herein, it is preferable that the solder-resist protective layer 124 is made of insulation material like epoxy to function as a mask or an insulation layer during plating or soldering.

The opening 126 is illustrated as an annular form surrounding the solder ball 128 in the drawing, which however does not limit the present invention, and can be variously modified according to designing conditions of the substrate 120.

In addition, there may be passive elements (not shown) such as a capacitor, inductor and resistor mounted near the semiconductor chip 110 on the substrate 120.

In order to prevent weakening of the power of supporting the semiconductor chip 110 due to the gap between the substrate 120 and the semiconductor chip 110 and strengthen the portions in contact with the solder balls 128, liquid underfill material made of insulation resin is injected through the gap using a dispenser (not shown) to fill the gap by capillary action. The underfill material is cured to form an underfill part 130 to support the semiconductor chip 110.

In the meantime, at least one gap compensation part 140 is provided in the opening 126 that exposes a portion of an upper surface of the substrate 120 and a portion of the electrode pattern 122 in order to prevent formation of voids due to non-uniform capillary action resulting from the uneven gap between the semiconductor chip 110 and the substrate 120 at the opening 126 during the injection of the underfill material.

Such a gap compensation part 140 is provided to substantially equalize a gap T2 between the semiconductor chip 110 and the electrode pattern 122, with a gap T3 between the semiconductor chip 110 and a part of the opening 126 that comes in contact with the underfill material before the electrode pattern 122, as the underfill material is injected between the semiconductor chip 110 and the substrate 120.

In order for the above, the portion of the gap compensation part 140 in the opening 126 has a thickness the same as a portion of the electrode pattern 122 exposed in the opening 126.

With the above configuration, the gap between the semiconductor chip 110 and the substrate 120 becomes substantially uniform with respect to an injection direction B of the underfill material. Thus, the capillary action of the underfill material injected therethrough takes place uniformly both at the gap compensation part 140 and at the protective layer 124, thereby allowing a uniform flow rate of the underfill material.

It is preferable that the gap compensation part 140 is oriented at least 90 degrees from the electrode pattern 122 about the solder ball 128.

As shown in FIGS. 4(a) and (b), the gap compensation part 140 can have a protrusion 141 continuously extended from the electrode pattern 122 on the substrate 120.

Herein, the protrusion 141 is made of the same material as the electrode pattern 122 and is formed simultaneously in the manufacturing process of the electrode pattern 122.

The protrusion 141 may be extended linearly from the electrode pattern 122 in a direction that corresponds to the injection direction of the underfill material, which however does not limit the present invention. Alternatively, the protrusion 141 may be extended from the electrode pattern 122, biased with respect to the injection direction of the underfill material.

In addition, it is preferable that a front end of the protrusion 141 comes in contact with an inner rim of the protective layer 124 that forms a boundary with the opening 126 in order to facilitate the flow of the underfill material via the protrusion 141 to the solder ball 128.

FIG. 5(a) is a partial plan view of a major part of a flip-chip semiconductor package according to a second embodiment of the present invention, and FIG. 5(b) is a partial sectional view thereof.

As shown in FIGS. 5(a) and (b), the gap compensation part 140 in the opening 126 can have a protrusion 142 extended in a predetermined length on the substrate 120 from the inner rim of the protective layer 124 that forms a boundary with the opening 126, to the solder ball 126.

The protrusion 142 is made of the same material as the protective layer 124 and can be integrally formed as the protective layer 124 is applied. It is preferable that a front end of the protrusion 142 is extended to the vicinity of an outer surface of the solder ball 128 to facilitate the flow of the underfill material via the protrusion 142 to the solder ball 128.

Figure 6:
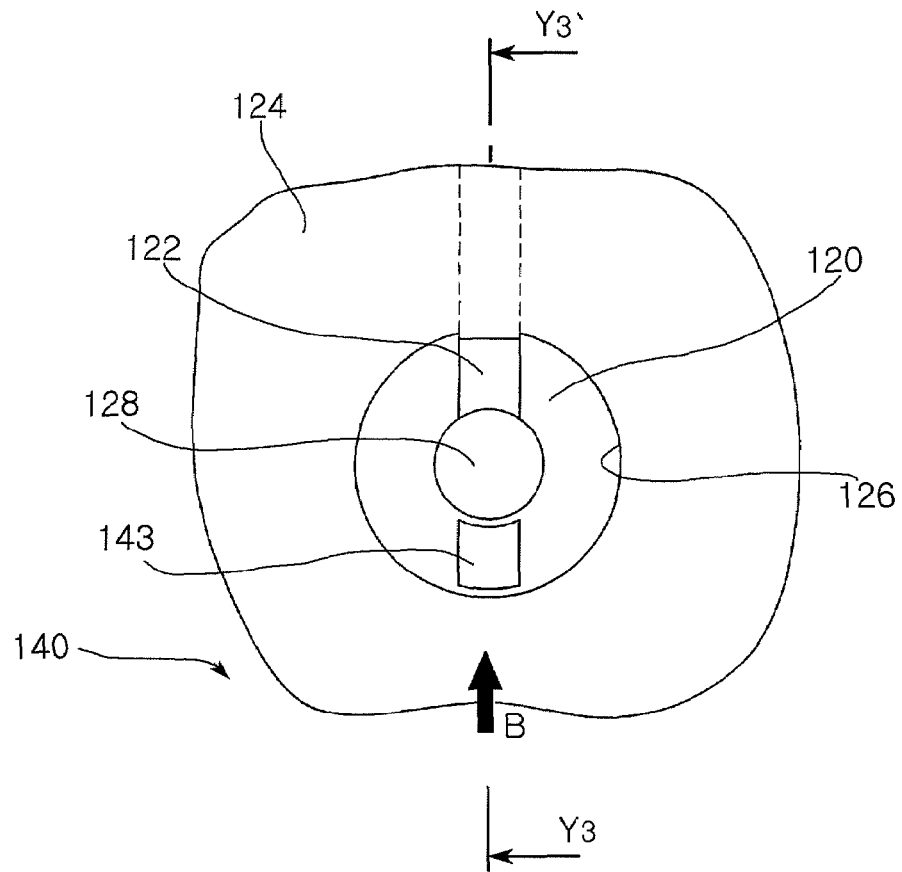
FIG. 6 illustrates a flip-chip semiconductor package according to a third embodiment of the present invention, in which (a) is a plan view of a major part and (b) is a sectional view taken along line Y3-Y3' of FIG. 6(a)
Figure 6:
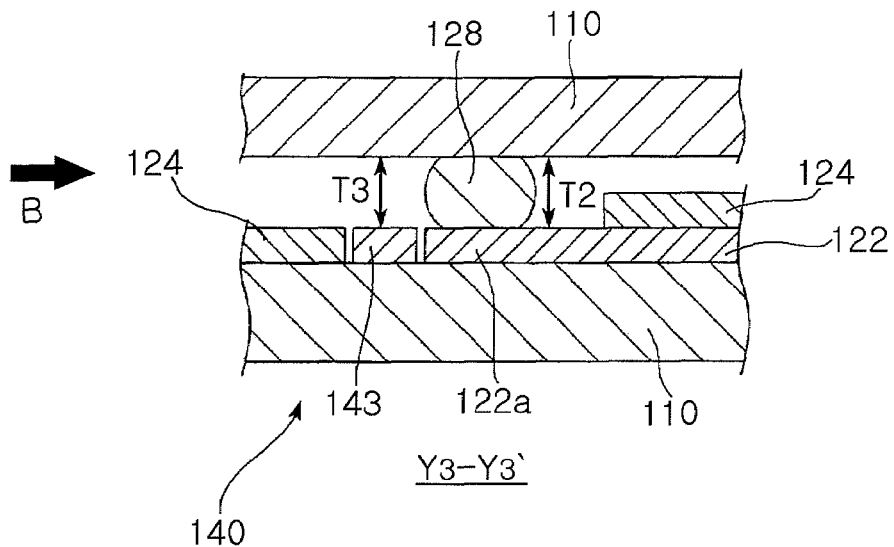

FIG. 6(a) is a partial plan view illustrating a major part of a flip-chip semiconductor package according to a third embodiment of the present invention, and FIG. 6(b) is a partial sectional view thereof.

As shown in FIGS. 6(a) and (b), the gap compensation part 140 in the opening 126 may have a protrusion 143 separately provided on the substrate 120 without having an end in contact with the electrode pattern 122 nor the other end in contact with the protective layer 124.

Herein, the protrusion 143 may be made of the same material as the electrode pattern 122 during the process of forming the electrode pattern 122, or alternatively, can be made of the same material as the protective layer 124 during the process of forming the protective layer 124.

In addition, an encapsulant (not shown) of resin such as epoxy can be formed over the semiconductor chip 110 and the substrate 120 to protect them from the outside environment.

Figure 7:
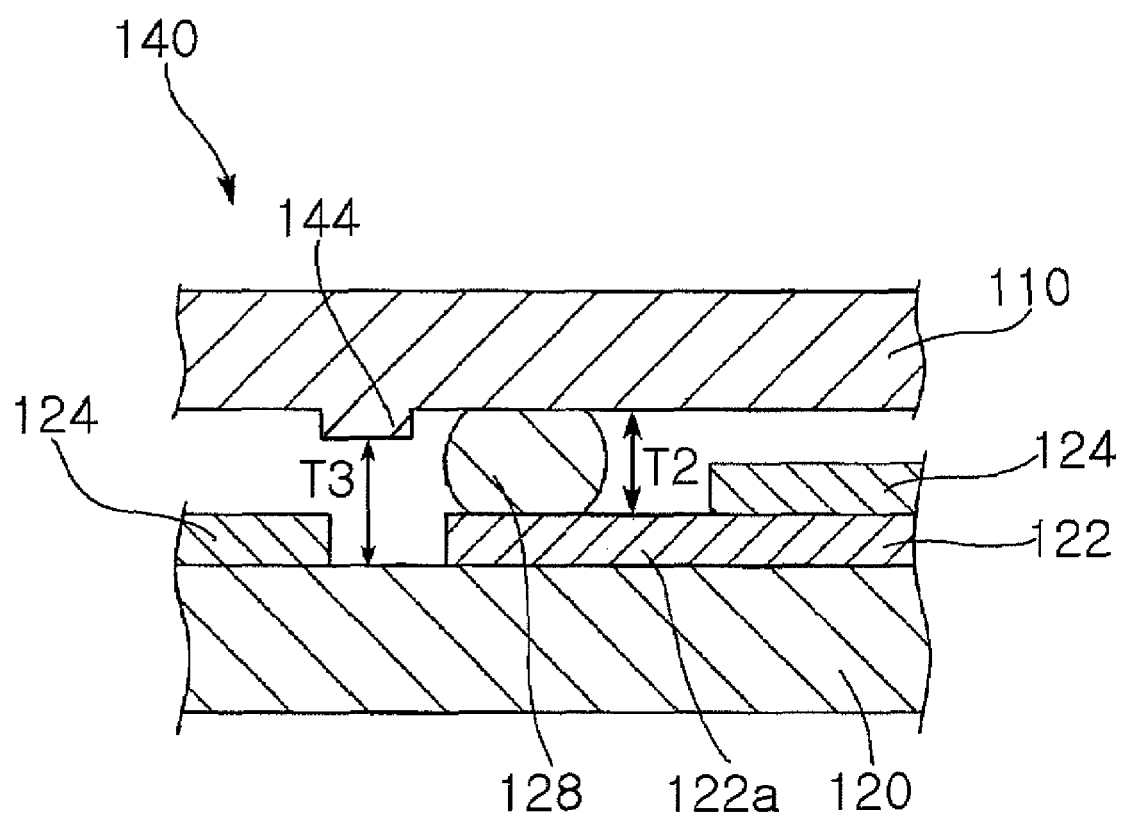
FIG. 7 is a partial sectional view illustrating a semiconductor chip package according to a fourth embodiment of the present invention.

FIG. 7 is a partial sectional view illustrating a major part of a flip-chip semiconductor package according to a fourth embodiment of the present invention.

As shown in FIG. 7, the gap compensation part 140 in the opening 126 may have a protrusion 144 protruding downward from an undersurface of the semiconductor chip 110 to the substrate 120, without having an end in contact with the electrode pattern 122 nor the other end in contact with the protective layer 124.

At this point, it is preferable that the protrusion 144 protrudes downward in such a dimension that the gap T3 between the electrode pattern 122 and the substrate 120 is substantially equalized with the gap T2 between the protective layer 124 and the substrate 120.

In the semiconductor package 100 with the above configuration, the solder-resist protective layer 124 is applied in a predetermined thickness on the substrate 120 to protect the electrode pattern pattern-printed on an upper surface of the substrate 120 as well as the substrate 120 during plating or soldering. The vicinity of the connection terminal of the electrode pattern 122 with the solder ball 128 to be placed thereon is exposed through the opening 126 where the protective layer 124 is not applied.

Thus, the solder ball 128 is placed on the connection terminal 122a of the electrode pattern 122, and the semiconductor chip 110 is electrically connected to the substrate 120 via the solder balls 128.

Then, the liquid underfill material is injected by a dispenser between the semiconductor chip 110 and the substrate 120 and cured to form the underfill part 130 in order to strengthen the power of supporting the semiconductor chip 110 and the portions in contact with the solder balls 128.

As shown in FIGS. 4(a) and (b), the gap compensation part 140 has a protrusion 141 which is extended from the electrode pattern 122 to come in contact first with the underfill material with respect to the injection direction B of the underfill material, during a process of injecting the underfill material between the semiconductor chip 110 and the substrate 120. Thus, the gap T3 between the protrusion 141 and the semiconductor chip 110 becomes substantially the same as the gap T2 between the electrode pattern 122 and the semiconductor chip 110.

Figure 5:
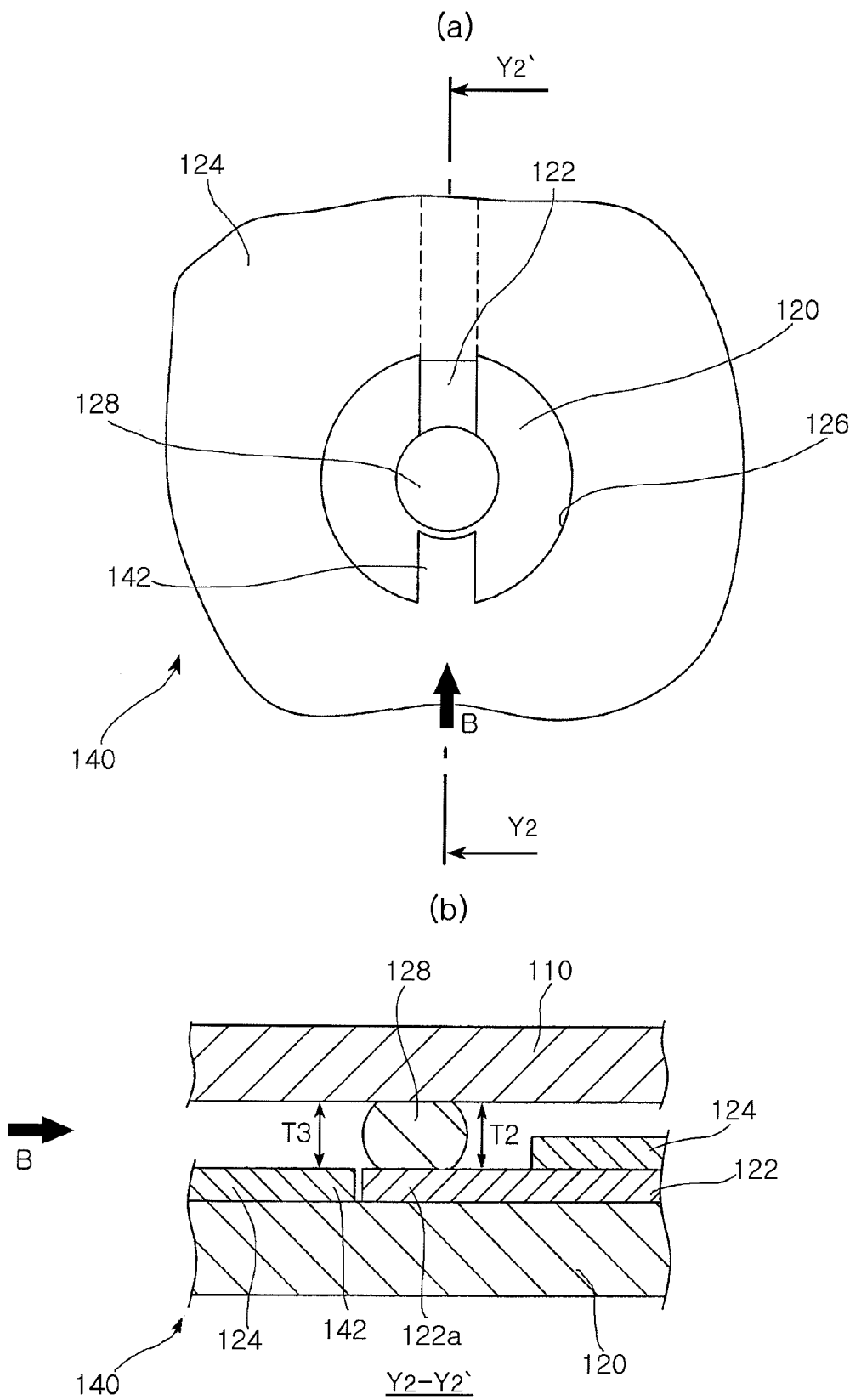
FIG. 5 illustrates a flip-chip semiconductor package according to a second embodiment of the present invention, in which (a) is a plan view of a major part and (b) is a partial sectional view taken along line Y2-Y2' of FIG. 5(a)

Herein, the gap compensation part 140 may have a protrusion 141 extended from the electrode pattern 122, which however does not limit the present invention. Alternatively, as shown in FIGS. 5 (a) and (b), the gap compensation part 140 may have a protrusion 142 extended from the protective layer 124, or as shown in FIGS. 6(a) and (b), may have a protrusion 143 having an end separated from the electrode pattern 122 and the other end separated from the protective layer 124. Further, as shown in FIG. 7, it may have a protrusion 144 protruding downward from an undersurface of the semiconductor chip 110.

With the above configurations, the flow rate of the underfill material spreading via the gap compensation part 140 to the solder ball 128 becomes substantially the same as that spreading via the protective layer 124 to the vicinity of the opening 126.

Therefore, the underfill material reaches an outer surface of the solder ball 7 to fill up the opening 126 without forming the void V by capturing air, facilitating the process of injecting the underfill material to fill up the space between the semiconductor chip 110 and the substrate 120.

According to the present invention set forth above, the gap compensation part is provided in the opening to equalize the gap between the semiconductor chip and the portion of the opening that comes in contact first with the underfill material, with the gap between the semiconductor chip and the protective layer. Thus, the injected underfill material flows via the gap compensation part to the solder ball at the same flow rate as via the protective layer to the vicinity of the opening, thereby filling up the opening without forming voids with air captured therein. Consequently, defective products are prevented, improving product reliability.

While the present invention has been shown and described in connection with the preferred embodiments, it will be apparent to those skilled in the art that modifications and variations can be made without departing from the spirit and scope of the invention as defined by the appended claims.

What is claimed is:

1. A void-free circuit board comprising:
    a protective layer covering and protecting an electrode pattern formed on an upper surface of a substrate, wherein the protective layer is applied around a solder ball provided on the electrode pattern except on an immediate vicinity of the solder ball to form an opening, and
    at least one gap compensation part comprising a protrusion that comes in contact with an underfill material injected toward the opening before the electrode pattern, the protrusion having a thickness substantially the same as that of a portion of the electrode pattern exposed in the opening.

2. The void-free circuit board according to claim 1, wherein the gap compensation part has a width substantially the same as that of a portion of the electrode pattern exposed in the opening.

3. The void-free circuit board according to claim 1, wherein the gap compensation part is oriented at least 90 degrees from the electrode pattern about the solder ball.

4. The void-free circuit board according to claim 1, wherein the protrusion of the gap compensation part is extended from the electrode pattern.

5. The void-free circuit board according to claim 4, wherein the protrusion is made of the same material as the electrode pattern and formed in a manufacturing process of the electrode pattern.

6. The void-free circuit board according to claim 4, wherein a front end of the protrusion is in contact with an inner rim of the protective layer.

7. The void-free circuit board according to claim 1, wherein the protrusion of the gap compensation part is extended from the protective layer to the solder ball.

8. The void-free circuit board according to claim 7, wherein the protrusion is made of the same material as the protective layer and formed as the protective layer is applied.

9. The void-free circuit board according to claim 7, wherein a front end of the protrusion is extended to a vicinity of an outer surface of the solder ball.

10. The void-free circuit board according to claim 1, wherein the protrusion of the gap compensation part is provided separately without having an end in contact with the electrode pattern nor the other end in contact with the protective layer.

11. The void-free circuit board according to claim 10, wherein the protrusion is made of the same material as the electrode pattern and formed in a manufacturing process of the electrode pattern.

12. The void-free circuit board according to claim 10, wherein the protrusion is made of the same material as the protective layer and formed as the protective layer is applied.

13. A flip-chip semiconductor package comprising:
    at least one semiconductor chip;
    a substrate having the semiconductor chip mounted thereon via a solder ball, an electrode pattern formed thereon, and a protective layer applied around the solder ball provided on the electrode pattern except on an immediate vicinity of the solder ball to form an opening;
    an underfill part formed by underfill material injected through a gap formed between the semiconductor chip and the substrate; and
    at least one gap compensation part comprising a protrusion that comes in contact with the underfill material injected toward the opening before the electrode pattern, the protrusion having a thickness substantially the same as that of a portion of the electrode pattern exposed in the opening.

14. The flip-chip semiconductor package according to claim 13, wherein the gap compensation part has a width substantially the same as that of a portion of the electrode pattern exposed in the opening.

15. The flip-chip semiconductor package according to claim 13, wherein the gap compensation part has a thickness substantially the same as that of a portion of the electrode pattern exposed in the opening.

16. The flip-chip semiconductor package according to claim 13, wherein the gap compensation part is oriented at least 90 degrees from the electrode pattern about the solder ball.

17. The flip-chip semiconductor package according to claim 13, wherein the protrusion of the gap compensation part is extended from the electrode pattern disposed on the substrate.

18. The flip-chip semiconductor package according to claim 17, wherein the protrusion is made of the same material as the electrode pattern and formed in a manufacturing process of the electrode pattern.

19. The flip-chip semiconductor package according to claim 17, wherein a front end of the protrusion is in contact with an inner rim of the protective layer.

20. The flip-chip semiconductor package according to claim 13, wherein the protrusion of the gap compensation part is extended from the protective layer to the solder ball.

21. The flip-chip semiconductor package according to claim 20, wherein the protrusion is made of the same material and formed as the protective layer is applied.

22. The flip-chip semiconductor package according to claim 20, wherein a front end of the protrusion is extended to a vicinity of an outer surface of the solder ball.

23. The flip-chip semiconductor package according to claim 13, wherein the protrusion of the gap compensation part is provided separately on the substrate without having an end in contact with the electrode pattern nor the other end in contact with the protective layer.

24. The flip-chip semiconductor package according to claim 23, wherein the protrusion is made of the same material as the electrode pattern and formed in a manufacturing process of the electrode pattern.

25. The flip-chip semiconductor package according to claim 23, wherein the protrusion is made of the same material as the protective layer and formed as the protective layer is applied.

26. The flip-chip semiconductor package according to claim 13, wherein the protrusion of the gap compensation part protrudes downward from a lower surface of the semiconductor chip to the substrate.

\* \* \* \* \*